United States Patent
Harame et al.

(10) Patent No.: US 9,356,097 B2
(45) Date of Patent: May 31, 2016

(54) METHOD OF FORMING A BIPOLAR TRANSISTOR WITH MASKLESS SELF-ALIGNED EMITTER

(71) Applicant: INTERNATIONAL BUSINESS MACHINES CORPORATION, Armonk, NY (US)

(72) Inventors: David L. Harame, Essex Junction, VT (US); Vikas K. Kaushal, Essex Junction, VT (US); Marwan H. Khater, Astoria, NY (US); Qizhi Liu, Lexington, MA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/926,644

(22) Filed: Jun. 25, 2013

(65) Prior Publication Data

US 2014/0374802 A1   Dec. 25, 2014

(51) Int. Cl.
*H01L 31/0328* (2006.01)
*H01L 29/08* (2006.01)
*H01L 29/66* (2006.01)
*H01L 29/417* (2006.01)
*H01L 29/732* (2006.01)
*H01L 29/737* (2006.01)
(Continued)

(52) U.S. Cl.
CPC ...... *H01L 29/0817* (2013.01); *H01L 29/41708* (2013.01); *H01L 29/66242* (2013.01); *H01L 29/66287* (2013.01); *H01L 29/732* (2013.01); *H01L 29/7378* (2013.01); *H01L 29/0649* (2013.01); *H01L 29/0804* (2013.01); *H01L 29/456* (2013.01); *Y10S 148/011* (2013.01)

(58) Field of Classification Search
CPC ............... H01L 29/66287; H01L 21/66242; H01L 29/41708; Y10S 148/011
USPC .................................................. 438/312, 320
See application file for complete search history.

(56) References Cited

U.S. PATENT DOCUMENTS 4,916,083 A * 4/1990 Monkowski et al. ......... 438/367
5,059,544 A   10/1991 Burghartz et al.
6,319,786 B1  11/2001 Gris
(Continued)

OTHER PUBLICATIONS

De Berranger, E., et al. "Performance Improvement in a 200 MM BiCMOS Technology by Si/SiGe Heterojunction Bipolar Transistor Integration". Proceeding of the 26th European Solid State Device Research Conference, 1996. ESSDERC '96. Date of Conference: Sep. 9-11, 1996. pp. 433-436.
(Continued)

*Primary Examiner* — Howard Weiss
(74) *Attorney, Agent, or Firm* — Michael Lestrange; Andrew M. Calderon; Roberts Mlotkowski Safran & Cole, P.C.

(57) ABSTRACT

Embodiments of the present invention include a method for forming a semiconductor emitter and the resulting structure. The invention comprises forming an epitaxial base layer on a semiconductor substrate. A dielectric layer is deposited over the epitaxial base layer. An opening is etched in a portion of the dielectric layer exposing a portion of the epitaxial base layer and a spacer is deposited along the sidewall of the opening. The emitter is grown from the epitaxial base layer to overlap the top surface of the spacer and a portion of the dielectric layer. The single crystal emitter is formed without a mask and without the requirement of subsequent patterning processes.

18 Claims, 5 Drawing Sheets

(51) Int. Cl.
*H01L 29/45* (2006.01)
*H01L 29/06* (2006.01)

(56) References Cited

U.S. PATENT DOCUMENTS

| | | | |
|---|---|---|---|
| 6,777,302 B1 * | 8/2004 | Chen et al. | 438/335 |
| 6,815,822 B2 | 11/2004 | Kondo et al. | |
| 6,855,612 B2 | 2/2005 | Muller et al. | |
| 7,687,887 B1 | 3/2010 | El-Diwany et al. | |
| 7,709,338 B2 | 5/2010 | Liu et al. | |
| 8,039,401 B2 | 10/2011 | Wang et al. | |
| 2003/0054599 A1 * | 3/2003 | Huizing et al. | 438/200 |
| 2004/0166645 A1 * | 8/2004 | Shideler | 438/312 |
| 2012/0319233 A1 | 12/2012 | Feilchenfeld et al. | |
| 2013/0187198 A1 * | 7/2013 | Camillo-Castillo et al. | H01L 29/417 257/197 |

OTHER PUBLICATIONS

IBM, et al. "BiCMOS Isolation Technology Using Epitaxial Lateral Overgrowth and Preferential Polishing". An IP.com Prior Art Database Technical Disclosure. Original Publication Date: Jul. 1, 1992. IP.com No. IPCOM000109082D. IP.com Electronic Publication: Mar. 23, 2005.

Mertens, H., et al. "Double-Polysilicon Self-Aligned SiGe HBT Architecture Based on Nonselective Epitaxy and Polysilicon Reflow". Bipolar/BiCMOS Circuits and Technology Meeting (BCTM), 2012 IEEE. Date of Conference: Sep. 30, 2012-Oct. 3, 2012. pp. 1-4.

Rich, D., et al. "BiCMOS Technology for Mixed-Digital, Analog, and RF Applications". Jun. 2002. IEEE Microwave Magazine. pp. 44-55.

\* cited by examiner

METHOD OF FORMING A BIPOLAR TRANSISTOR WITH MASKLESS SELF-ALIGNED EMITTER

FIELD OF THE INVENTION

The present invention relates generally to the fabrication of semiconductor devices, and more particularly to the fabrication of a bipolar transistor.

BACKGROUND OF THE INVENTION

A bipolar junction transistor (BJT) is a type of transistor that relies on the contact of two types of semiconductor material for its operation and can be found either as individual discrete components, or in large numbers as parts of integrated circuits. A BJT consists of three differently doped semiconductor regions, the emitter region, the base region and the collector region creating two pn-junctions, known as the emitter-base junction and the collector-base junction. Typically these regions are created by doping a semiconductor material, such as silicon, with different dopants to create a p-type and an n-type material.

Bipolar transistors come in two types, or polarities, known as PNP and NPN based on the doping types of the three main terminal regions. The PNP type BJT uses an n-type material for the base region and p-type material for the emitter region and collector region. The NPN type BJT uses a p-type material for the base region and n-type material for the base region and collector region. The following discussion is generally in the terms of NPN transistors, but it is to be understood that the discussion is applicable to PNP transistors as well.

The heterojunction bipolar transistor (HBT) is a type of BJT that uses differing semiconductor materials for the emitter and base regions, creating a heterojunction. For example, an emitter and collector may use doped silicon while the collector uses a silicon-germanium alloy.

Bipolar transistors, for example, as used in bipolar complementary metal-oxide semiconductor (BiCMOS) processes, include an emitter formed as a pedestal over a planar base region that overlies a collector. The emitter is bounded on opposing sides by dielectric spacers, which overlay a portion of the base region. The emitter is typically formed by depositing a layer of doped polysilicon over the base region and dielectric spacers, and defining the emitter using standard photolithographic patterning.

The base region directly under the junction with the emitter is typically referred to as an intrinsic base region, while the base region falling outside of the emitter and the spacer is referred to as an extrinsic base region. Alignment of the various steps used to fabricate the various regions of the base region, the base-emitter junction, and the emitter can be difficult to control.

SUMMARY

Embodiments of the present invention include a method for forming a semiconductor emitter. The invention comprises forming an epitaxial base layer on a semiconductor substrate. A dielectric layer is deposited over the epitaxial base layer. An opening is etched in a portion of the dielectric layer exposing a portion of the epitaxial base layer and a spacer is deposited along the sidewall of the opening. The emitter is grown from the epitaxial base layer to overlap the top surface of the spacer and a portion of the dielectric layer. The single crystal emitter is formed without a mask and without the requirement of subsequent patterning processes.

Embodiments of the present invention also include the structure of a semiconductor emitter. The invention comprises a semiconductor substrate and includes a collector region. An epitaxial base layer is on the collector region and a dielectric layer is on the epitaxial base layer. An opening in the dielectric layer exposes at least a portion of the epitaxial base layer and there is a spacer located along a sidewall of the opening. An emitter is grown from the epitaxial base layer to overlap a top surface of the spacer and a portion of the dielectric layer.

DETAILED DESCRIPTION

Embodiments of the present invention provide a bipolar transistor having a monocrystalline emitter formed using a maskless process. Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Figure 1:
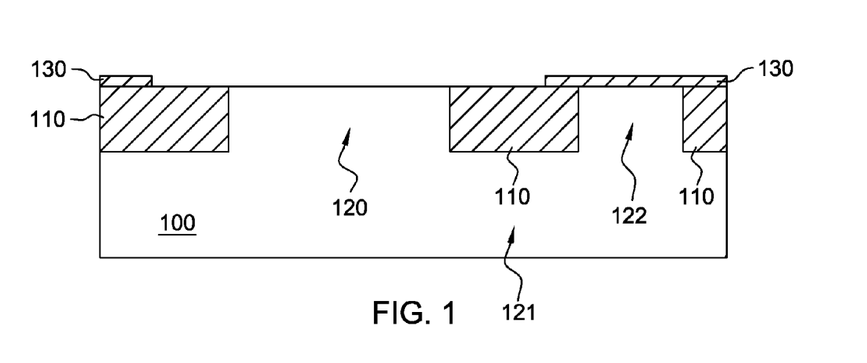
FIG. 1 depicts a cross sectional view of a semiconductor substrate upon which embodiments of the invention may be fabricated.

Referring now to the figures, FIG. 1 depicts a cross sectional view of semiconductor substrate 100 upon which embodiments of the invention may be fabricated and includes shallow trench isolation (STI) regions 110. Semiconductor substrate 100 is preferably composed of a silicon containing material that includes, but is not limited to, silicon, silicon germanium alloys, silicon carbon alloys, or silicon germanium carbon alloys. In this exemplary embodiment, semiconductor substrate 100 is n-type crystalline silicon. The doping of semiconductor substrate 100 may vary for optimal performance. STI regions 110 are patterned by known processes in semiconductor substrate 100 and are filled with an insulating material such as a silicon oxide. STI regions 110 define collector region 120 and collector reach through region 122. Collector region 120 is the first region of a BJT and is connected to the collector reach through region 122 by subcollector region 121, below STI region 110. The collector reach through region provides an area to electrically contact collector region 120 and subcollector region 121 as described in detail below. Isolation layer 130, composed of an insulating material such as silicon oxide, is patterned on the surface of semiconductor substrate 100 over collector reach through region 122 to provide protection of collector reach through region 122 during processing of the base region as described in detail below.

Figure 2:
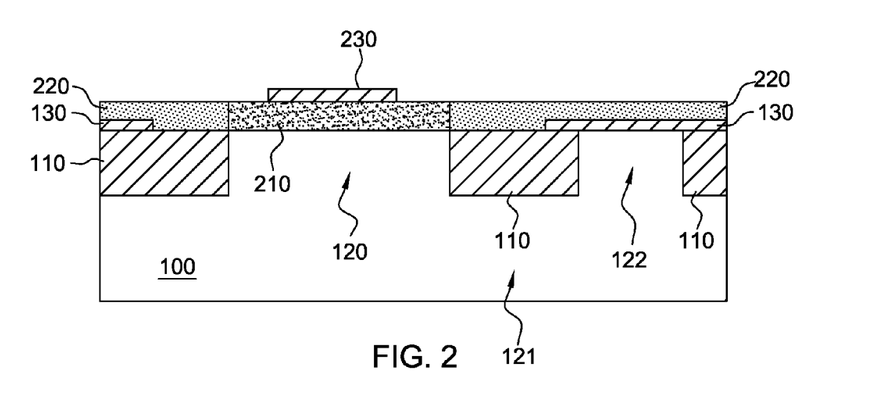
FIG. 2 illustrates the formation of the base region of a BJT according to an illustrative embodiment.

FIG. 2 illustrates the formation of a base region of a BJT according to an illustrative embodiment. A layer of semiconductor material is deposited over collector region 120, and at least portions of STI regions 110 and isolation layer 130 creating intrinsic base region 210 and extrinsic region 220 using, for example, non-selective epitaxy. Epitaxial structures are typically grown from gaseous or liquid precursors, with a substrate acting as a seed crystal layer. The epitaxial layer is preferably a single-crystal layer that continues the crystal structure of collector region 120. In a preferred embodiment, a layer of p-type silicon-germanium is deposited by non-selective epitaxial growth over the n-type collector creating the first pn-junction of the heterojunction bipolar transistor (HBT) type of BJT. The deposited non-selective epitaxial layer maintains the single crystal structure of semiconductor substrate 100 in collector region 120 forming single crystal intrinsic base region 210, and the deposited non-selective epitaxial layer forms polycrystalline extrinsic region 220 over STI regions 110 and isolation layers 130, using for example, low temperature epitaxy (LTE). In an exemplary embodiment, the non-selective epitaxial growth process of the SiGe layer is started with a thin layer of Silicon. Germanium is introduced to form intrinsic base region 210 and extrinsic region 220, and the growth process is finished with Silicon. The Si/SiGe/Si structure is used to improve the diffusion characteristics of intrinsic base region 210. Alternatively, the intrinsic base region 210 can be deposited by selective epitaxy, where no extrinsic polycrystalline region is deposited.

In other embodiments, the intrinsic base region 210 and extrinsic region 220 are formed using non-selective epitaxial growth of p-type silicon or other suitably doped material, creating a BJT. In another embodiment, an intrinsic base region is created by doping a top layer of the semiconductor substrate in collector region 120 with a suitable doping material (not shown in the figure). A p-type intrinsic base may be created using ion implantation, for example, to dope the semiconductor substrate with boron.

Dielectric pad 230 is then formed on the surface of the intrinsic base region 210. For example, forming dielectric pad 230 may include depositing a layer of insulating material such as silicon oxide over intrinsic base region 210 and extrinsic region 220, and patterning the layer using known photolithographic processes. The properties of dielectric pad 230 are discussed in more detail below.

Figure 3:
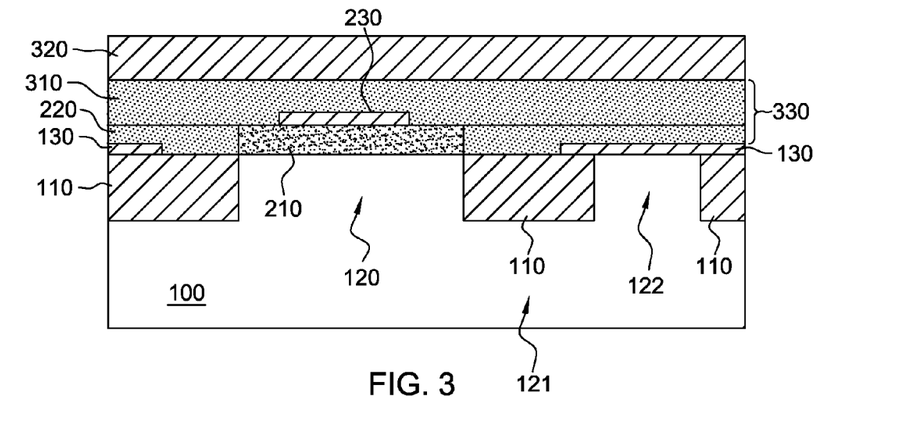
FIG. 3 illustrates the formation of an extrinsic base layer of the BJT according to an illustrative embodiment.

FIG. 3 illustrates the deposition of extrinsic base layer 310 of the BJT according to an illustrative embodiment. A layer of semiconducting material of the same type as intrinsic base region 210 is deposited over the intrinsic base region 210 and the extrinsic region 220. Extrinsic base layer 310 is preferably doped at a higher concentration than intrinsic base region 210 to provide improved electrical conductivity. Collectively, extrinsic region 220 and extrinsic base layer 310 form extrinsic base region 330. Oxide isolation layer 320 is deposited over extrinsic base layer 310.

Figure 4:
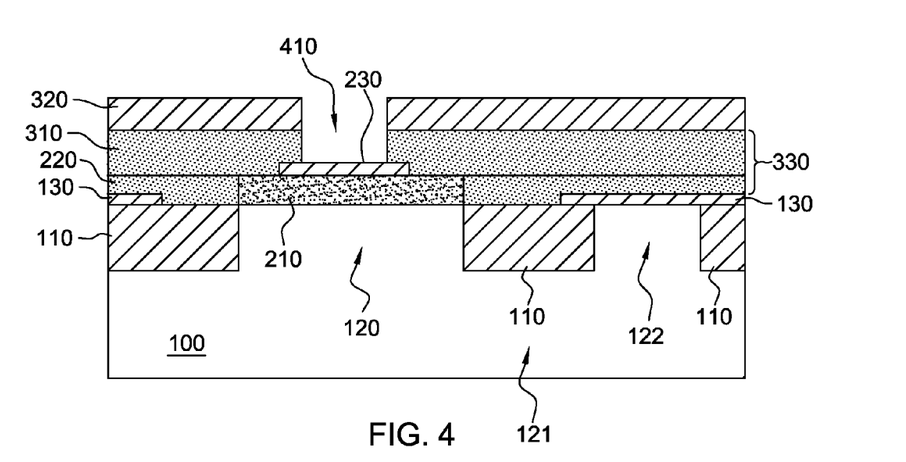
FIG. 4 depicts the formation of an emitter opening according to an illustrative embodiment.

FIG. 4 depicts the formation of emitter opening 410 according to an illustrative embodiment. For example, standard photolithographic processes are used to define the emitter opening in a layer of photoresist (not shown). Typically emitter opening 410 is formed as a long, narrow channel. Oxide isolation layer 320 and extrinsic base layer 310 are removed to create emitter opening 410 using, for example, reactive ion etching (RIE). RIE uses chemically reactive plasma, generated by an electromagnetic field, to remove various materials. A person of ordinary skill in the art will recognize that the type of plasma used will depend on the material to be removed, or that other etch processes, e.g., wet chemical etch, laser ablation, etc., may be used. The previously defined dielectric pad 230 is used as an etch stop to protect intrinsic base region 210 during the etching process. As such, dielectric pad 230 is comprised of a material that is not etched by the process used to remove extrinsic base layer 310 or that etches at a substantially slower rate than extrinsic base layer 310, thereby protecting intrinsic base region 210 during the etching process.

Figure 5:
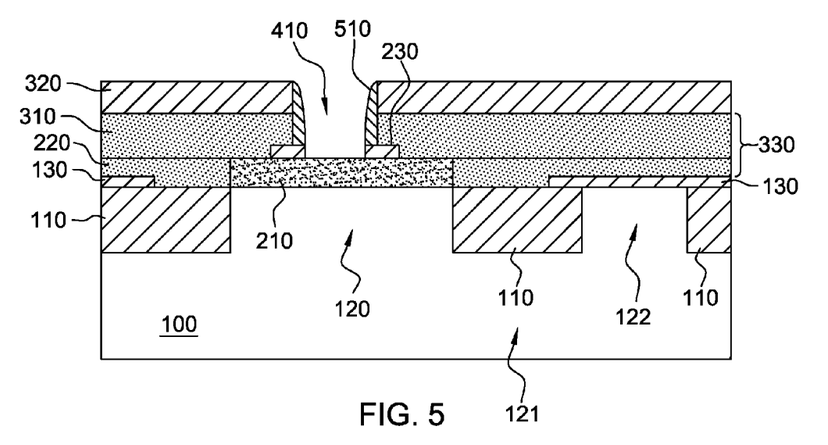
FIG. 5 illustrates the formation a dielectric spacer according to an illustrative embodiment.

FIG. 5 illustrates the formation of dielectric spacer 510 according to an illustrative embodiment. For example, forming dielectric spacer 510 may include depositing a conformal layer (not shown) of insulating material, such as silicon nitride, over oxide isolation layer 320 and into emitter opening 410, such that the thickness of the deposited layer on the sidewall of emitter opening 410 is substantially the same as the thickness of the deposited layer on the surface of oxide isolation layer 320. An anisotropic etch process, wherein the etch rate in the downward direction is greater than the etch rate in the lateral directions, may be used to remove the insulating layer, thereby forming dielectric spacer 510.

The exposed portion of dielectric pad 230 is then removed from the base of emitter opening 410 exposing a portion the crystalline intrinsic base region 210, defining the area for the second pn-junction.

Figure 6:
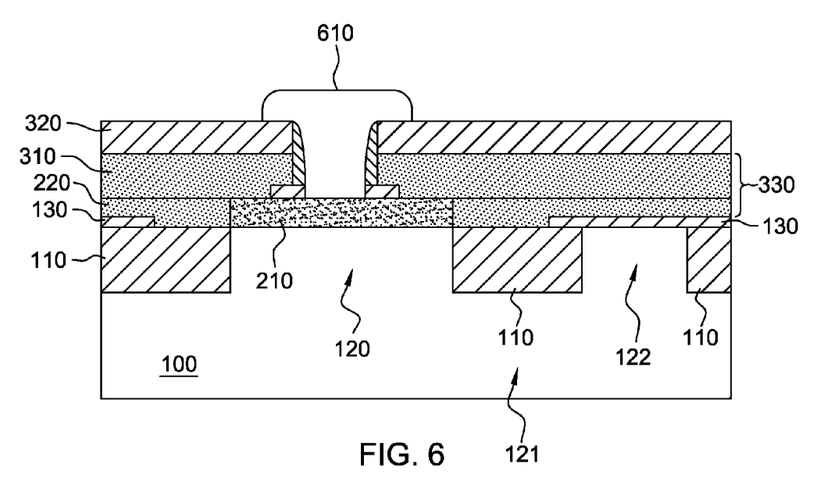
FIG. 6 depicts the formation an emitter of a BJT according to an embodiment of the present invention.

FIG. 6 depicts the formation an emitter of the BJT according to an embodiment of the present invention. Using a process such as selective epitaxy, emitter 610 is grown as a single crystal from the exposed surface of intrinsic base region 210 in emitter opening 410. In the preferred embodiment, n-type silicon is grown selectively, wherein the silicon grows only from the exposed intrinsic base region 210 and does not grow from oxide isolation layer 320. The n-type silicon emitter grown on the p-type intrinsic base creates the second pn-juction of the BJT using, for example, chemical vapor deposition (CVD). The crystal growth initiates at the base of emitter opening 410 and continues to grow upward, filling emitter opening 410. As the crystal growth reaches the upper surface of oxide isolation layer 320, the crystal growth continues upward and also grows laterally along the surface of oxide isolation layer 320 forming the "T" shape of the contact landing of emitter 610. As a result of using selective epitaxy wherein the semiconductor material grows only from the exposed intrinsic base region 210, and not on oxide isolation layer 320, emitter 610 is created as a single crystal without the requirement of subsequent definition using photolithographic processing.

In other embodiments, the emitter is grown from intrinsic base region 210 in emitter opening 410 using selective epitaxy of a semiconductor material, such as silicon, to form emitter 610. The emitter 610 is subsequently doped to create the appropriate type of semiconductor using, for example, ion implantation or in-situ doping during the epitaxy process. In the example of an NPN bipolar transistor, the n-type emitter is doped with, for example, phosphorous.

The crystal plane orientation of intrinsic base region 210 and the direction of the channel of emitter 610 can affect the relative growth rates during selective epitaxy in the lateral direction versus the upward direction resulting in faceting. Miller indices are used to describe the particular crystal planes and directions using three bracketed integers, for example <101>. The type of bracket determines if the description is of a crystal plane or a crystal direction. Round brackets, ( ) describe a crystal plane, while square brackets, [ ], describe a crystal direction. Additionally, straight brackets, < >, are used to describe a family of equivalent directions. In an exemplary embodiment, the exposed surface of intrinsic base region 210 in emitter opening 410 is a (100) crystal plane and the emitter channel direction is <100>. The resulting emitter 610 grown in the <100> crystal direction by selective epitaxy includes a flat top surface with rounded corners as depicted in FIG. 6. In another exemplary embodiment, the emitter channel direction is <110>. The resulting emitter structure grown from the (100) surface in the emitter channel of this <110> orientation by selective epitaxy includes crystal faceting creating a non-flat top surface of emitter 610 (not shown) due to increased growth rate in the upward direction versus the lateral direction. It has been shown in the art that the effect of faceting can be reduced or eliminated by decreasing the temperature, increasing the pressure, and/or altering the chemistry of the selective epitaxy process resulting in an emitter structure as depicted in FIG. 6. In an exemplary embodiment, a decreased temperature below 700° C. and increased pressure to 30 Torr, as well as, adjustment of the ratios/chemistry of the gases of the selective epitaxy process are used so as not to restrict the particular crystal plane of the exposed intrinsic base region 210 and to grow non-faceted crystalline silicon regardless of the crystalline orientation of the growth surface.

In another embodiment, emitter 610 can be further tailored to meet physical or electrical characteristics of the device. For example, the thickness of the top portion of emitter 610 that extends laterally along the surface of oxide isolation layer 320 can be reduced, post epitaxial growth completion, using a suitable etch process affecting the step height and/or electrical characteristics such as capacitance of the contact landing of emitter 610.

Figure 7:
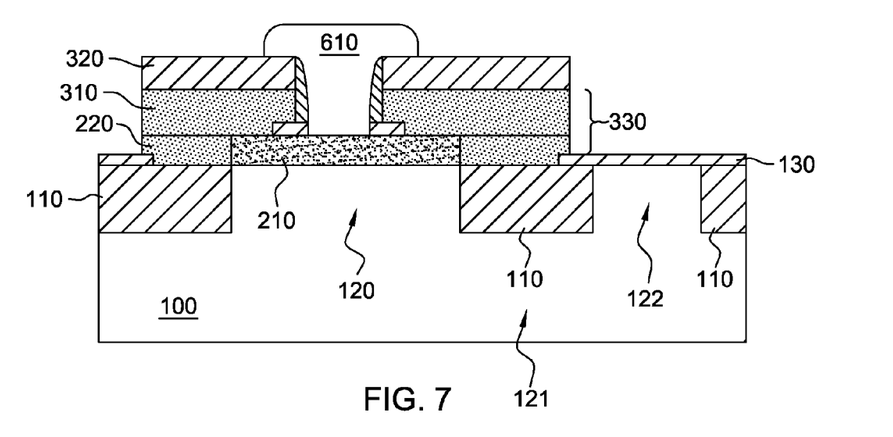
FIG. 7 illustrates the patterning of an extrinsic base region according to an illustrative embodiment.

FIG. 7 illustrates the patterning of extrinsic base region 330 according to an illustrative embodiment. For example, a layer of photoresist is applied (not shown) and patterned using standard photolithographic techniques covering emitter 610, extending outward overlapping an area above STI regions 110. Oxide isolation layer 320, extrinsic base layer 310, and extrinsic region 220 are removed from areas not protected by the photoresist using standard etching methods, and the photoresist is removed.

Figure 8:
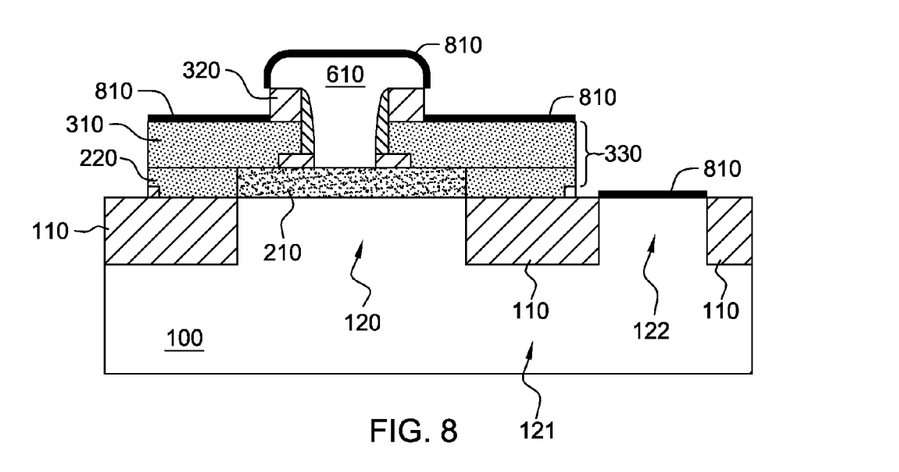
FIG. 8 depicts the formation of silicide contact regions according to an illustrative embodiment.

FIG. 8 depicts the formation of the silicide contact regions according to an illustrative embodiment. Oxide isolation layer 320 and isolation layer 130 are removed from the exposed surfaces using standard etching methods exposing extrinsic base layer 310 and the surface of collector reach through region 122. Metal silicide contacts 810 are formed on all exposed silicon surfaces using, for example cobalt, tungsten or nickel.

Figure 9:
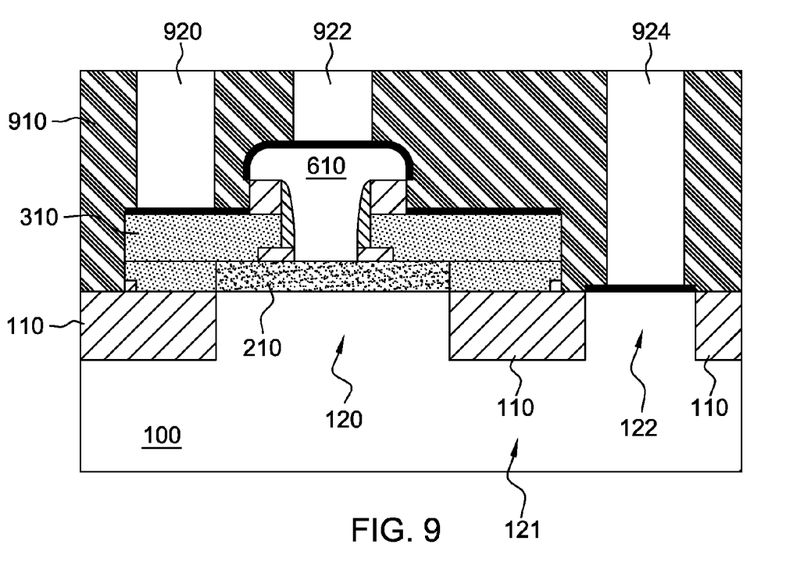
FIG. 9 illustrates the formation of base, emitter and collector contacts of the BJT according to an illustrative embodiment.

FIG. 9 illustrates the formation of base, emitter and collector contacts of the BJT according to an illustrative embodiment. Contact dielectric layer 910, such as silicon oxide, is deposited over the surface and planarized using standard polishing processes. Photolithographic and etching processes are used to create holes in contact dielectric layer 910 for base contact 920, emitter contact 922 and collector contact 924. The holes are filled with a conductive material, such as tungsten, to create the three terminals of the transistor, base contact 920, emitter contact 922 and collector contact 924.

The resulting semiconductor device may be included on a semiconductor substrate comprising many devices and one or more wiring levels to form an integrated circuit chip.

The resulting integrated circuit chip(s) can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier), or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described preferred embodiments of a tunable semiconductor device (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A method of forming a semiconductor emitter, the method comprising the steps of:

forming at least an epitaxial base layer on a semiconductor substrate;

depositing a dielectric layer directly on top of the epitaxial base layer, which is used as an etch stop to protect the epitaxial base layer during a subsequent etching process;

etching a portion of the dielectric layer to form an opening exposing at least a portion of the epitaxial base layer;

depositing a spacer along a sidewall of the opening, wherein a portion of the dielectric layer extends past the sidewall in a plane parallel to the epitaxial base layer; and forming an emitter, where the emitter grows from the epitaxial base layer in a <100> crystal direction to overlap a top surface of the spacer and a portion of the dielectric layer.

2. The method of claim 1, wherein the emitter grows by selective epitaxy.

3. The method of claim 2, wherein the selective epitaxy is chemical vapor deposition (CVD).

4. The method of claim 2, wherein a temperature of the selective epitaxy is less than 700° C to reduce faceting.

5. The method of claim 1, wherein the emitter is a single crystal.

6. The method of claim 1, wherein the emitter is a component of a heterojunction bipolar transistor (HBT).

7. The method of claim 1, wherein an extrinsic base layer is deposited on the epitaxial base layer.

8. The method of claim 7, further comprising etching a portion of the dielectric layer and a portion of the extrinsic base layer to form an opening exposing at least a portion of the epitaxial base layer.

9. The method of claim 1, further comprising etching the emitter to tailor the dimensions of a contact landing.

10. The method of claim 1, wherein the emitter is T-shaped including rounded edges and a substantially flat top surface.

11. The method of claim 1, wherein forming the at least the epitaxial base layer includes forming the at least the epitaxial base layer directly on an uppermost surface of the semiconductor substrate, wherein the method further comprises forming a metal silicide contact directly on the uppermost surface of a semiconductor substrate.

12. The method of claim 11, further comprising:
depositing a contact dielectric layer;
creating a hole in the contact dielectric layer to form a collector contact directly in contact with the metal silicide; and
filling the collector contact with a conductive material.

13. the method of claim 12, further comprising:
creating a second hole in the contact dielectric layer to form an emitter contact directly on the emitter; and
filling the emitter contact with a conductive material.

14. The method of claim 13, further comprising:
creating a third hole in the contact dielectric layer to form a base contact; and
filling the base contact with a conductive material.

15. A method of forming a semiconductor emitter, the method comprising the steps of:

forming at least an epitaxial base layer directly on an uppermost surface of a semiconductor substrate;

depositing a dielectric layer directly on top of the epitaxial base layer, which is used as an etch stop to protect the epitaxial base layer during a subsequent etching process;

etching a portion of the dielectric layer to form an opening exposing at least a portion of the epitaxial base layer;

depositing a spacer along a sidewall of the opening, wherein a portion of the dielectric layer extends past the sidewall in a plane parallel to the epitaxial base layer; and forming an emitter, where the emitter grows from the epitaxial base layer in a <100 > crystal direction to overlap a top surface of the spacer and a portion of the dielectric layer.

16. The method of claim 15, further comprising:
depositing a contact dielectric layer;
creating a hole in the contact dielectric layer to form a collector contact directly in contact with the metal silicide; and
filling the collector contact with a conductive material.

17. the method of claim 16, further comprising:
creating a second hole in the contact dielectric layer to form an emitter contact directly on the emitter; and
filling the emitter contact with a conductive material.

18. The method of claim 17, further comprising:
creating a third hole in the contact dielectric layer to form a base contact; and
filling the base contact with a conductive material.

* * * * *